United States Patent
Shen et al.

(10) Patent No.: US 9,240,817 B2
(45) Date of Patent: Jan. 19, 2016

(54) WALL FASTENER FOR WIRELESS TRANSMISSION MODULE

(71) Applicants: LITE-ON ELECTRONICS (GUANGZHOU) LIMITED, Guangzhou (CN); LITE-ON TECHNOLOGY CORPORATION, Taipei (TW)

(72) Inventors: Chun-Ching Shen, New Taipei (TW); Wei-Hung Yang, New Taipei (TW)

(73) Assignees: LITE-ON ELECTRONICS (GUANGZHOU) LIMITED, Guangzhou (CN); LITE-ON TECHNOLOGY CORPORATION, Taipei (TW)

( * ) Notice: Subject to any disclaimer, the term of this patent is extended or adjusted under 35 U.S.C. 154(b) by 298 days.

(21) Appl. No.: 13/931,699

(22) Filed: Jun. 28, 2013

(65) Prior Publication Data

US 2014/0306078 A1 Oct. 16, 2014

(30) Foreign Application Priority Data

Apr. 12, 2013 (CN) ...................... 2013 2 0182456 U (51) Int. Cl.
| | |
|---|---|
| *A47B 96/06* | (2006.01) |
| *H04B 1/3888* | (2015.01) |
| *H05K 5/02* | (2006.01) |
| *H04M 1/02* | (2006.01) |

(52) U.S. Cl.
CPC ............ *H04B 1/3888* (2013.01); *H05K 5/0204* (2013.01); *H04M 1/0293* (2013.01)

(58) Field of Classification Search
CPC combination set(s) only.
See application file for complete search history.

(56) References Cited

U.S. PATENT DOCUMENTS

| | | | | |
|---|---|---|---|---|
| 4,227,238 | A * | 10/1980 | Saito | 361/801 |
| 4,447,030 | A * | 5/1984 | Nattel | 248/27.1 |
| 4,632,594 | A * | 12/1986 | Del Tufo et al. | 403/322.4 |
| 4,699,341 | A * | 10/1987 | Ponticelli | 248/27.1 |
| 5,796,585 | A * | 8/1998 | Sugiyama et al. | 361/735 |
| 6,371,424 | B1 * | 4/2002 | Shaw | 248/222.12 |
| 6,446,913 | B1 * | 9/2002 | Schroeder | 248/27.1 |
| 6,520,605 | B2 * | 2/2003 | Nunokawa et al. | 312/111 |
| 6,697,250 | B2 * | 2/2004 | Kuo | 361/679.6 |
| 6,909,598 | B2 * | 6/2005 | Cheng et al. | 361/679.22 |
| 6,938,966 | B1 * | 9/2005 | Rouwhorst | 312/111 |
| 7,273,203 | B2 * | 9/2007 | Carnevali | 248/553 |
| 7,377,603 | B2 * | 5/2008 | Quijano | 312/245 |
| 7,726,617 | B2 * | 6/2010 | Zambelli et al. | 248/288.31 |
| 8,123,182 | B2 * | 2/2012 | Sonntag et al. | 248/220.22 |
| 8,152,122 | B2 * | 4/2012 | Hsu et al. | 248/231.91 |
| 8,191,837 | B2 * | 6/2012 | Chen et al. | 248/176.1 |
| 8,605,434 | B2 * | 12/2013 | Chao | 361/690 |
| 9,027,893 | B2 * | 5/2015 | Cheng et al. | 248/231.9 |
| 2002/0190172 | A1 * | 12/2002 | Oddsen, Jr. | 248/289.11 |
| 2004/0195842 | A1 * | 10/2004 | Lin | 292/116 |
| 2005/0127260 | A1 * | 6/2005 | Dittmer | 248/221.11 |
| 2010/0188812 | A1 * | 7/2010 | Morrison et al. | 361/679.58 |
| 2011/0089304 | A1 * | 4/2011 | Fenelon | 248/404 |
| 2013/0301216 | A1 * | 11/2013 | Trinh et al. | 361/679.58 |

* cited by examiner

*Primary Examiner* — Monica Millner (74) *Attorney, Agent, or Firm* — Li & Cai Intellectual Property (USA) Office (57) ABSTRACT

The wall fastener for a wireless transmission module includes a supporting frame and a case. The supporting frame has a front face, a rear face, a first engagement portion and a slot. The case has a rear plate which has an outer face, an inner face, a second engagement portion and a stopper. The stopper partially projects out of the outer face. The first and second engagement portions mate and the stopper is received by the slot. The wireless transmission module and the supporting frame are tightly engaged and easily disengaged by a tool.

10 Claims, 7 Drawing Sheets

WALL FASTENER FOR WIRELESS TRANSMISSION MODULE

BACKGROUND

1. Field of the Invention

The instant disclosure relates to a wall fastener; in particular, to a wall fastener for a wireless transmission module.

2. Description of Related Art

Because of the development of network associated hardware, its wide use has been rooted in our daily life. A single device for network connection cannot satisfy the ever increasing demand for information from the Internet. The price of associated hardware is decreasing and it has become common for a single user to have more than one device being connected to a network. The trend of heavy signal trafficking is inevitable. The associated hardware for establishing a smaller network domain is available in the market. Wireless transmission is more favorable compared to the other transmission methods and it can be distributed to multiple devices simultaneously.

The conventional wireless transmission module or related hardware is secured on the wall by a fixed rack. This arrangement avoids cumbersome routing and saves space. Also, the signal transmission maintains its stable quality in the distribution.

However, the conventional rack is metallic and locked to the wall. The wireless transmission module is mounted on the rack and typically screws are used to enhance the engagement. For easier disengagement, press fit system may be adapted. In the case of screw fastening, the wireless transmission module cannot be easily removed whereas the press fit system may leave the wireless transmission module being snatched or accidentally taken away by a child.

SUMMARY OF THE INVENTION

The instant disclosure provides a wall fastener for a wireless transmission module which is easy to assemble and not easy to disengage. The wall fastener provides secure engagement and spares the wireless transmission module from undesired removal.

The wall fastener for a wireless transmission module includes a supporting frame and a case. The supporting frame has a front face, a rear face, a first engagement portion and a slot. The case has a rear plate which has an outer face, an inner face, a second engagement portion and a stopper. The stopper partially projects out of the outer face. The first and second engagement portions mate and the stopper is received by the slot.

The wall fastener of the instant disclosure uses the first and second engagement portions for mating and the stopper is received by the slot. Through the two different locking systems, the wireless transmission module can be attached to the supporting frame without using additional fasteners. A simple, conventional tool is required to disengage the wall fastener. Therefore the wireless transmission module can not be snatched directly or taken away by a child. The re-assembly is not a problem either.

In order to further understand the instant disclosure, the following embodiments are provided along with illustrations to facilitate the appreciation of the instant disclosure; however, the appended drawings are merely provided for reference and illustration, without any intention to be used for limiting the scope of the instant disclosure.

DETAILED DESCRIPTION OF THE PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

First Embodiment

Figure 1:
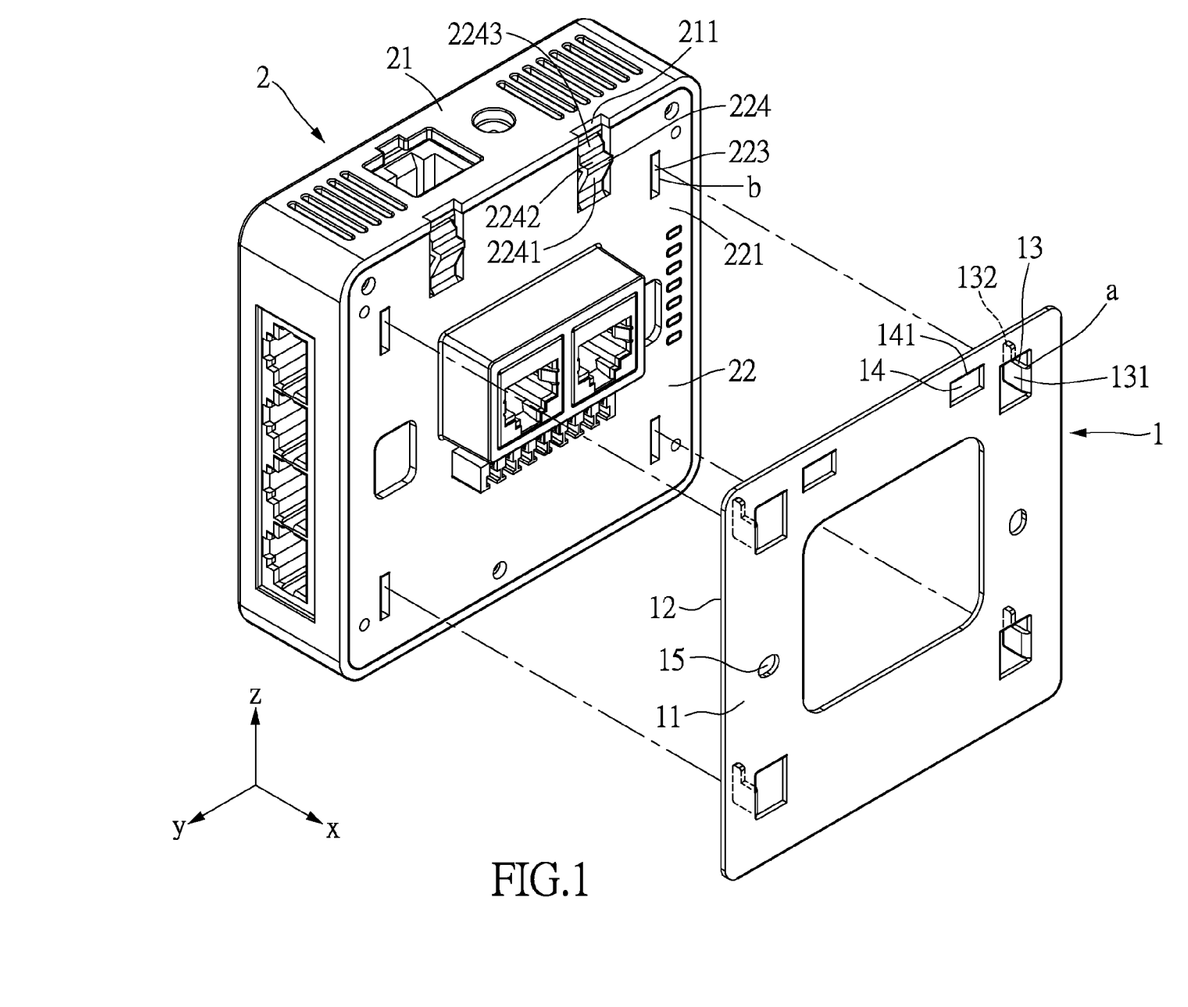
FIG. 1 is a perspective view showing an unfinished product of a wall fastener for a wireless transmission module in accordance with the instant disclosure.
Figure 2:
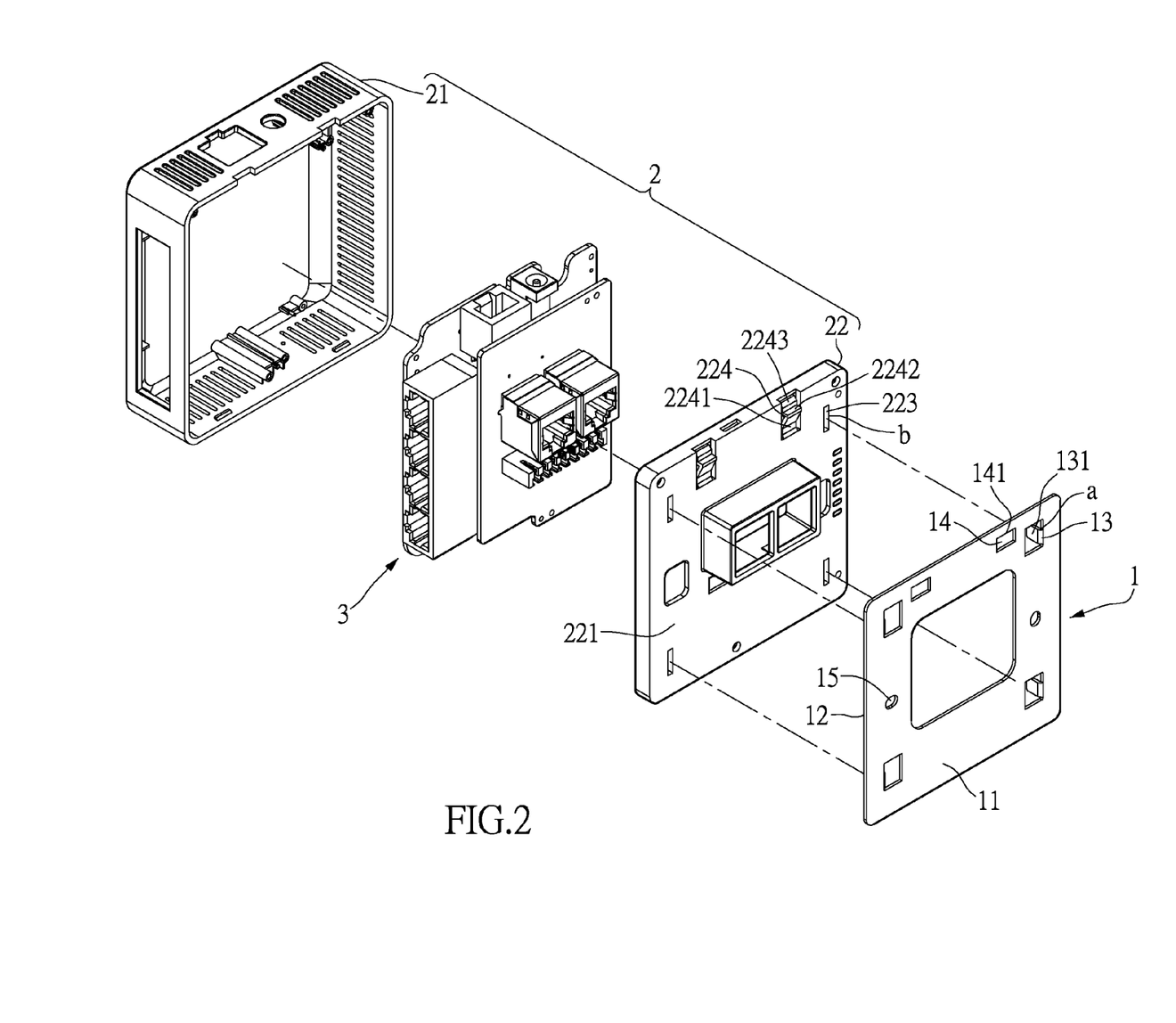
FIG. 2 is an exploded perspective view showing a wall fastener for a wireless transmission module in accordance with the instant disclosure.
Figure 3:
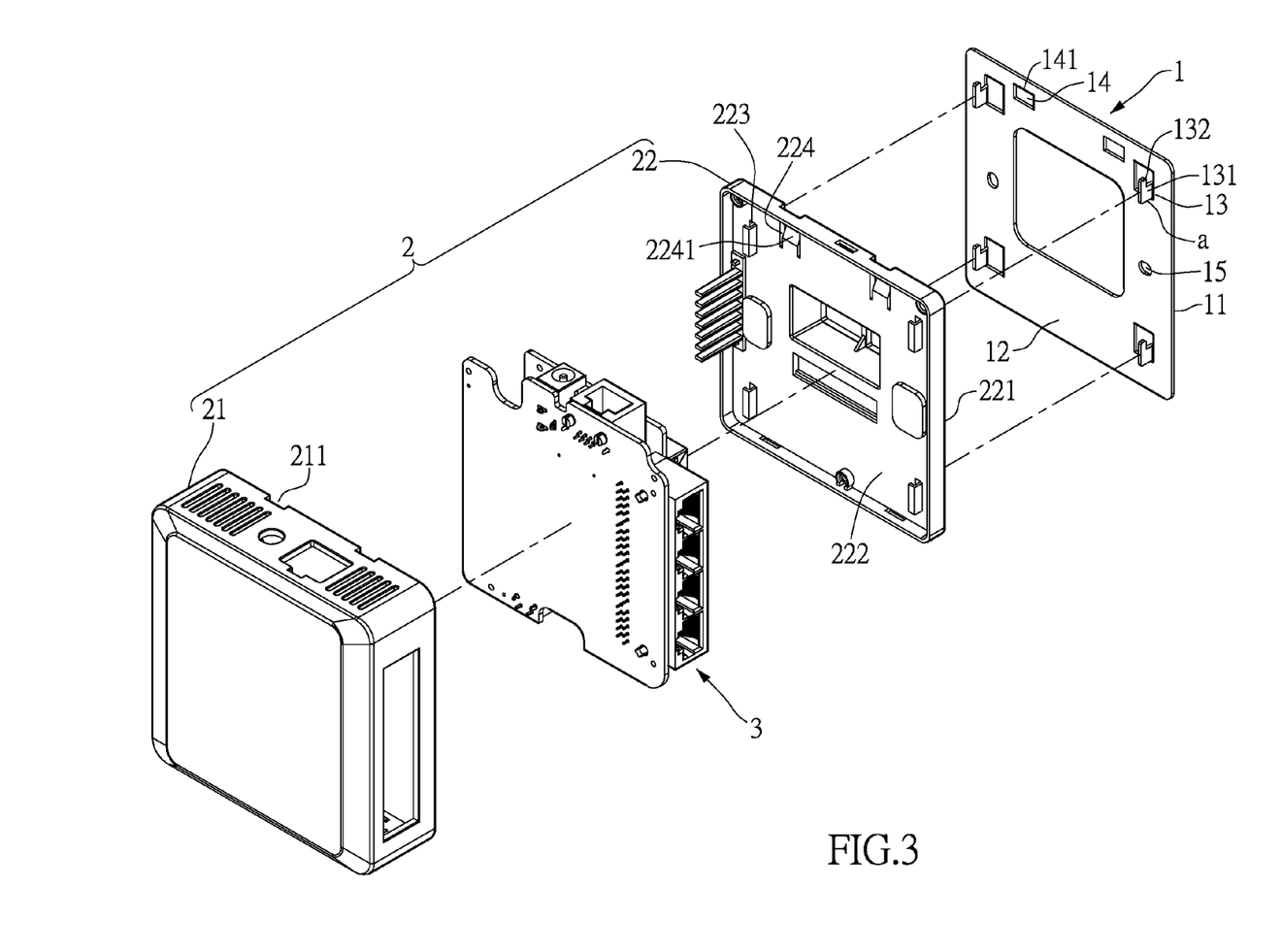
FIG. 3 is an exploded perspective view from another angle showing a wall fastener for a wireless transmission module in accordance with the instant disclosure.

Referring to FIGS. 1 to 3, the instant disclosure provides a wall fastener for a wireless transmission module. The wall fastener includes a supporting frame 1 and a case 2. The supporting frame 1 can be fixed on the wall. The case 2 is adapted to accommodate the wireless transmission module. The wireless transmission module can be a wireless router, a wireless broadband router, a wireless base station or the like and the instant disclosure is not limited thereto. The wireless transmission module is fixed to the wall by the supporting frame 1.

The material and configuration of the supporting frame 1 are not limited to the instant embodiment. For example, the supporting frame 1 can be configured to be square, round, oval, polygonal and other geometric configuration. In the instant embodiment, the supporting frame 1 is metallic and shaped to be a rectangle for accommodating the case 2. The supporting frame 1 has a front face 11 and a back face 12 opposite the front face 11.

The supporting frame 1 has a first engagement portion 13 and a slot 14. The quantity of the first engagement portion 13 is at least one and it can be two, three, four or above. The quantity and the location of the first engagement portion 13 are not limited by the instant embodiment. In the instant embodiment, four first engagement portions 13 are disposed at the four corners of the supporting frame 1. The instant embodiment is not intended to limit the configuration of the first engagement portion 13 to that as illustrated and described herein. In the instant embodiment, the first engagement portion 13 resembles a hook A. The first engagement portion 13 is a plate projecting from the back face 12. The first engagement portion 13 (hook A) may have an arm 131 and a finger 132. The arm 131 connects to the supporting frame 1 at one end and horizontally extends (along the X axis in FIG. 1) a predetermined length. The finger 132 connects to the other end of the arm 131 and points toward a vertical direction (the Z axis in FIG. 1) therefrom.

The quantity of the slot 14 is at least one and it can be two or more. In the instant embodiment, the supporting frame 1 has two slots 14. The slots 14 are formed at the two upper corners of the supporting frame 1 whereas the instant disclosure is not limited to these locations. The slots 14 are configured to be square and going through the front and back faces 11, 12. The slot 14 has a lip 141. The supporting frame 1 is also formed with a plurality of holes 15 for securing the supporting frame 1 onto the wall.

The case 2 of the wireless transmission module has a front case 21 and a rear plate 22. The front case 21 and the rear plate 22 collectively form the hollow case 2. The case 2 receives a signal transmission module 3. The rear plate 22 has an outer face 221 and an inner face 222. The rear plate 22 has a second engagement portion 223 and a stopper 224. The number of the second engagement portion 223 is at least one and it can be two, three, four or above. In the instant embodiment, each of the first engagement portions 13 corresponds to one of the second engagement portions 223 and therefore there are four second engagement portions 223. In the instant embodiment, the second engagement portion 223 resembles a slit B. The slit B is a vertical slit going along the Z axis as shown in FIG. 1. The slit B extends a predetermined length and cuts through the outer and inner faces 221, 222. The length and width of the second engagement portion 223 are larger than those of the first engagement portion 13 and therefore the first engagement portion 13 can pass through the second engagement portion 223.

The stopper 224 can only fit into the supporting frame through a single direction. During disengagement, tools are required to conduct the detachment. The quantity of the stopper 224 is at least one and it can be two, three, four or above. In the instant embodiment, the case 2 has two stoppers 224 corresponding to the slots 14. That is to say, the stoppers 224 are disposed at the two upper corners of the rear plate 22. In the instant embodiment, the stopper 224 has an flange 2241. One end of the flange 2241 connects to the rear plate 22 and the flange 2241 slantingly poses therefrom serving as a guiding slope. The other end of the flange 2241 may be formed with a protruding portion 2242 which further connects to a pushing portion 2243. The flange 2241 and the protruding portion 2242 project out from the outer face 221. In other words, the stopper 224 is configured to be partially protruded on the outer face 221. The periphery of the case 2 is formed with recesses 211 for receiving the stoppers 224. The recess 211 allows access to the pushing portion 2243 of the stopper 224 such that a tool can press against the pushing portion 2243. The recess 211 may be formed on the front case 21 alone or crossing between the front and the rear plate 22 (not labeled). The pushing portion 2243 of the stopper 224 is accessible from the recess 211 of the front case 21 whose dimension is sufficient for inserting a tool. If the pushing portion 2243 of the stopper 224 is not entirely accessible from the recess 211 of the front case 21, the recess 211 may expand to the rear plate 22 for an easier access to the pushing portion 2243.

Figure 4:
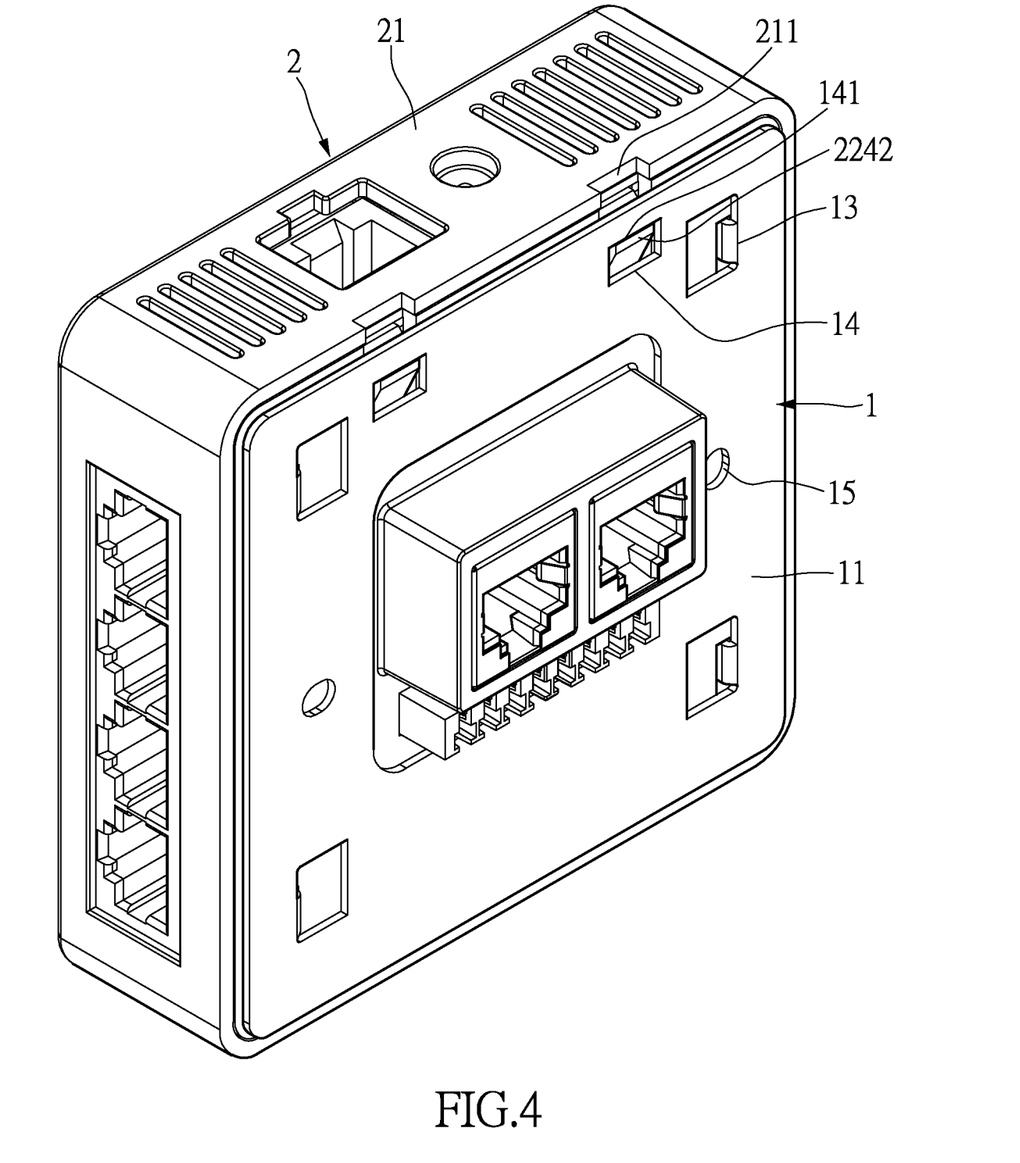
FIG. 4 is a perspective view showing a complete wall fastener for a wireless transmission module in accordance with the instant disclosure.
Figure 5:
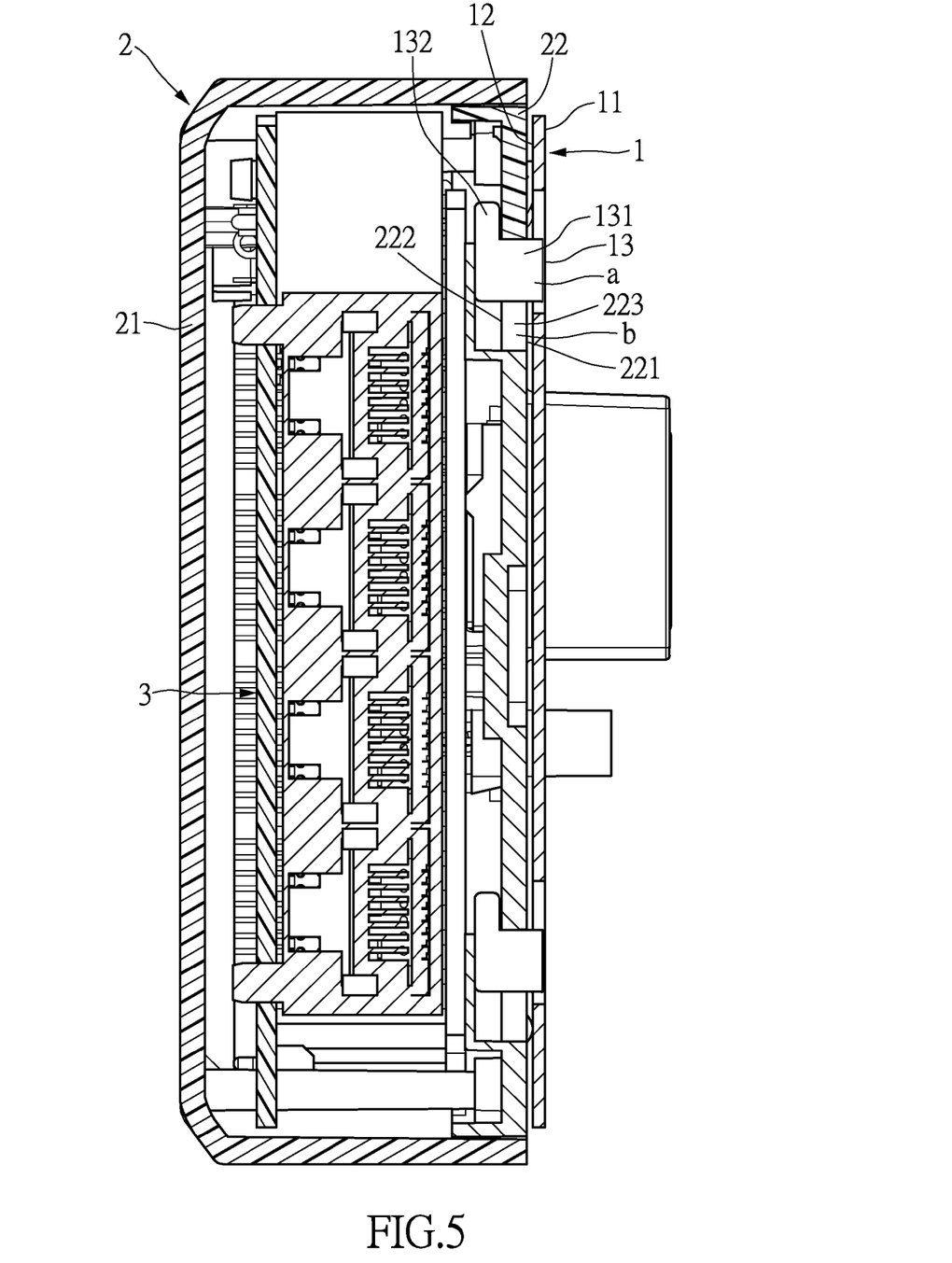
FIG. 5 is a first cross-sectional view of a wall fastener for a wireless transmission module in accordance with the instant disclosure.
Figure 6:
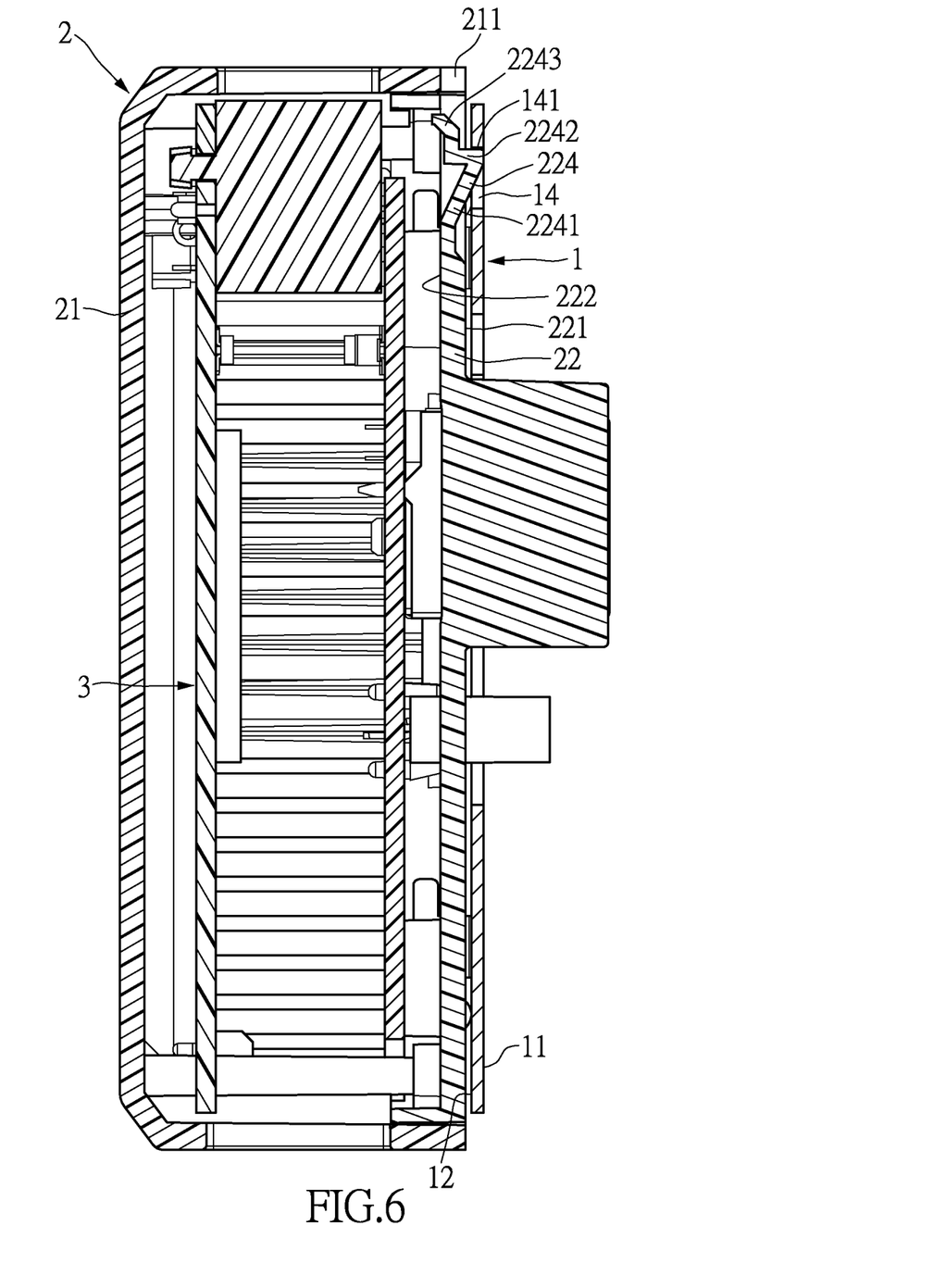
FIG. 6 is a second cross-sectional view of a wall fastener for a wireless transmission module in accordance with the instant disclosure.

Referring to FIGS. 4 to 6, the case 2 is assembled to the supporting frame 1. The first and the second engagement portions 13, 223 mate and the stoppers 224 are locked in the slots 14. The detailed steps of assembling the wall fastener are elaborated herein. Firstly, the second engagement portion 223 (slot B) of the case 2 is aligned to the first engagement portion 13 (hook A) of the supporting frame 1. Then the first engagement portion 13 (hook A) is received by the second engagement portion 223 (slot B). After the first engagement portion 13 (hook A) is completely inserted to the second engagement portion 223 (slot B), the case 2 slides downwardly. Specifically, the case 2 is pushed downwardly along the Z axis. The engagement between the first and second engagement portions 13, 223 is double checked. Meanwhile, the top edge of the arm 131 abuts the top edge of the slot B, and therefore the case 2 can not move down along the Z axis. The edge of the finger 132 abuts the inner face 222 of the rear plate 22 such that the case 2 can not move along the X axis. The two sides of the arm 131 abut the inner walls of the slit B such that the case 2 can not move along the Y axis. Upon engaging, the stoppers 224 of the case 2 mate the slots 14 of the supporting frame 1 and the protruding portion 2242 abuts the lip 141 such that the case 2 can not move upward along the Z axis. In other words, the case 2 is completely locked in the direction of Z axis.

In another embodiment of the instant disclosure, the slots 14 may not cut through the front face 11. That is to say, the slots 14 form as depression on the rear face 12 and they still serve the same purpose as receiving the stoppers 224.

The case 2 can be removed from the supporting frame 1 and the detachment steps are described below. Firstly, a tool (for example, a screw driver) is inserted to the recess 211 of the case 2. The tool abuts the pushing portion 2243 and the stopper 224 is pushed inwardly toward the case 2. As a result, the stopper 224 is disengaged from the slot 14. When the tool is inserted, the case 2 should be pushed upward along the Z axis such that the first and second engagement portions 13, 223 are parted. The wireless transmission module is then free to be taken off.

In addition, the case 2 may have only one stopper 224 disposed at the middle portion thereof yet the instant disclosure is not limited thereto. The single corresponding slot 14 is formed at the middle portion of the supporting frame 1. In this regard, the disengagement of the case 2 can be done more easily by one hand. Specifically, the tool is inserted to the recess 211 and abuts the pushing portion 2243. Then the stopper 224 is pushed inwardly toward the case 2. As a result, the stopper 224 is disengaged from the slot 14. When the tool is inserted, the case 2 should be pushed upward along the Z axis such that the first and second engagement portions 13, 223 are parted. The case 2 is then free to be taken off.

Second Embodiment

Figure 7:
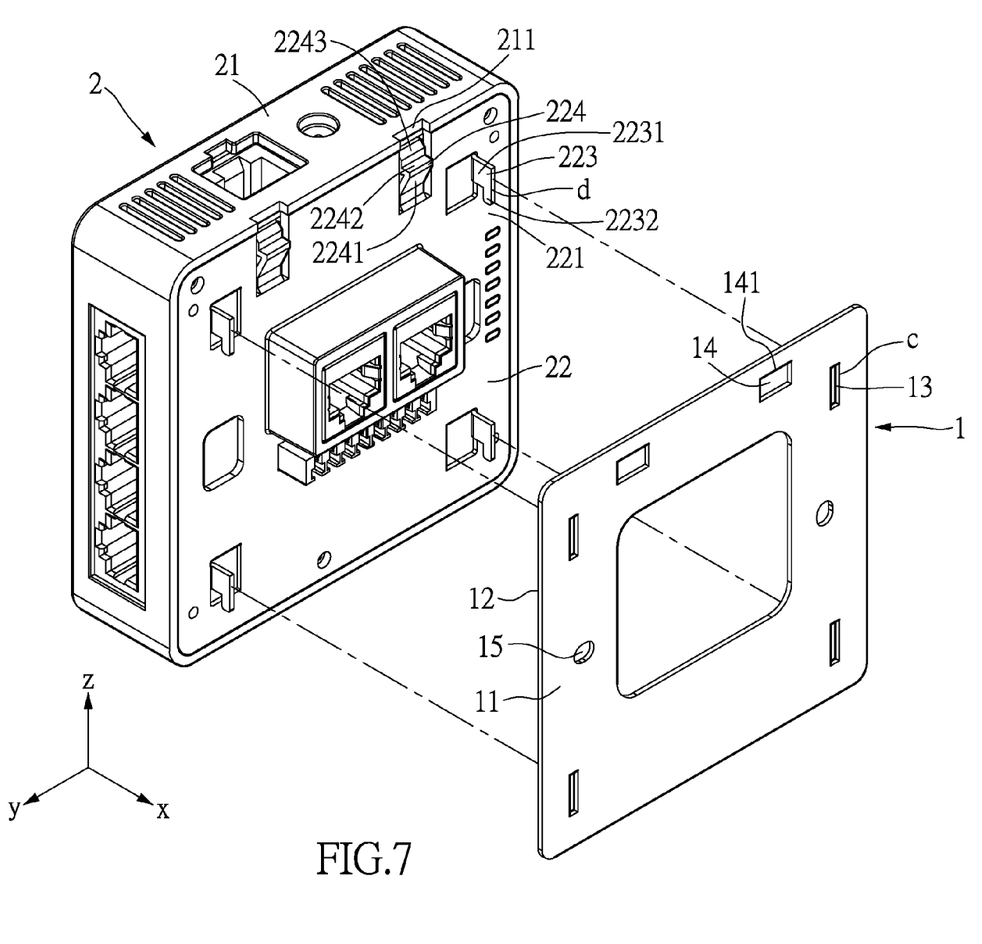
FIG. 7 is a perspective view showing an unfinished of a wall fastener for a wireless transmission module in accordance with another embodiment of the instant disclosure.

Referring to FIG. 7, the difference between the instant embodiment and the first embodiment arises from the slit. In the instant embodiment, the first engagement portion 13 of the supporting frame 1 is a slit C. The slit C cuts through the front and the rear faces 11, 12. The second engagement portion 223 of the case 2 is a hook D. The hook D projects out of the outer face 221 and the second engagement portion 223 (hook D) may have an arm 2231 and a finger 2232. The hook D is engaged with the slit C such that the first and second engagement portions 13, 223 mate. The stopper 224 is also received by the slot 14. In the instant embodiment, the wall where the supporting frame 1 is fixed on may be formed with corresponding grooves (not shown) for receiving the Hook D of the case 2. Therefore the hook D can smoothly mate with the slit C without interfering with the wall.

The wall fastener of the instant disclosure uses the first and second engagement portions for mating and the stopper is received by the slot. Through the two different locking systems, the wireless transmission module can be attached to the supporting frame without using additional fasteners.

The assembly and engagement of the instant disclosure is quick and easy. Without using additional tools, the wall fastener can be assembled yet it prevents accidental removal. A simple, conventional tool can disengage the wall fastener. Therefore the wireless transmission module can not be snatched directly or taken away by a child. The re-assembly is not a problem either.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A wall fastener for a wireless transmission module comprising:
    a supporting frame having a front face, a rear face, a first engagement portion and a slot; and
    a case having a rear plate, the rear plate having an outer face, an inner face, a second engagement portion and a stopper partially projecting out of the outer face, and the case has a recess;
    wherein the first and second engagement portions mate and the stopper is received by the slot, wherein the stopper has a flange, one end of the flange connects the rear plate, the other end of the flange is formed with a protruding portion, and the stopper has a pushing portion over and connected to the protruding portion,
wherein when a tool is inserted to the recess of the case, the tool abuts the pushing portion, the stopper is pushed inwardly toward the case, and the stopper is disengaged from the slot thereby.

2. The wall fastener for a wireless transmission module according to claim 1, wherein a periphery of the case is formed with the recess for receiving the pushing portion.

3. The wall fastener for a wireless transmission module according to claim 1, wherein the slot cuts through the front and rear faces.

4. The wall fastener for a wireless transmission module according to claim 1, wherein the first engagement portion is a hook projecting out of the rear face, the second engagement portion is a slit cutting through the outer and the inner faces, and the hook is received by the slit.

5. The wall fastener for a wireless transmission module according to claim 4, wherein the hook has an arm and a finger, one end of the arm connects the supporting frame, and another end of the arm extends to form the finger.

6. The wall fastener for a wireless transmission module according to claim 5, wherein an upper edge of the arm abuts an upper wall of the slit, and the finger abuts the inner face of the rear plate.

7. The wall fastener for a wireless transmission module according to claim 5, wherein sides of the arm abut an inner wall of the slit.

8. The wall fastener for a wireless transmission module according to claim 4, wherein the hook is a plate, and the slit is a groove.

9. The wall fastener for a wireless transmission module according to claim 1, wherein the first engagement portion is a slit cutting through the front and the rear faces, the second engagement portion is a hook projecting out of the outer face, and the hook is received by the slit.

10. The wall fastener for a wireless transmission module according to claim 1, wherein the recess is at a first surface of the case, and the slot is at the second surface of the supporting frame, the first surface and the second surface are substantially perpendicular.

* * * * *